United States Patent
Lee et al.

(10) Patent No.: US 10,446,425 B2
(45) Date of Patent: Oct. 15, 2019

(54) SUBSTRATE TREATING SYSTEM

(71) Applicant: SEMES CO., LTD., Chungcheongnam-do (KR)

(72) Inventors: Junghwan Lee, Gyeonggi-do (KR); Raetaek Oh, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 49 days.

(21) Appl. No.: 15/655,190

(22) Filed: Jul. 20, 2017

(65) Prior Publication Data

US 2018/0033661 A1 Feb. 1, 2018

(30) Foreign Application Priority Data

Jul. 29, 2016 (KR) .................. 10-2016-0096810

(51) Int. Cl.
| | |
|---|---|
| *B25J 15/00* | (2006.01) |
| *H01L 21/673* | (2006.01) |
| *B65G 49/07* | (2006.01) |
| *H01L 21/677* | (2006.01) |
| *H01L 21/687* | (2006.01) |
| *H01L 21/67* | (2006.01) |

(52) U.S. Cl.
CPC ........ *H01L 21/67309* (2013.01); *B65G 49/07* (2013.01); *H01L 21/67184* (2013.01); *H01L 21/67766* (2013.01); *H01L 21/67778* (2013.01); *H01L 21/67781* (2013.01); *H01L 21/68707* (2013.01)

(58) Field of Classification Search
CPC ......... H01L 21/67184; H01L 21/67766; H01L 21/67781
See application file for complete search history.

(56) References Cited

U.S. PATENT DOCUMENTS

2011/0110752 A1* 5/2011 Tauchi .............. H01L 21/67184
414/217
2014/0227072 A1* 8/2014 Lee .................... H01L 21/6838
414/744.3

FOREIGN PATENT DOCUMENTS

| JP | 2011-530189 A | 12/2011 |
|---|---|---|
| JP | 5852821 B | 4/2013 |
| KR | 1020050045284 A | 5/2005 |
| KR | 10-2005-0087211 A | 8/2005 |
| KR | 1020070020755 A | 2/2007 |
| KR | 1020100059350 | 6/2010 |
| KR | 1020120008854 A | 2/2012 |

* cited by examiner

*Primary Examiner* — Muhammad S Islam
(74) *Attorney, Agent, or Firm* — Li & Cai Intellectual Property (USA) Office

(57) ABSTRACT

Disclosed is a substrate treating system. The substrate treating system includes an index unit having a port, on which a container containing a substrate is positioned, and an index robot, a process executing unit having substrate treating apparatuses for treating the substrate and a main transferring robot for transferring the substrate, and a buffer unit disposed between the process executing unit and the index unit and in which the substrate fed between the process executing unit and the index unit temporarily stays. Each of the index robot, the substrate treating apparatuses, the main transferring robot, and the buffer unit includes a conductive part contacting the substrate to remove static electricity of the substrate.

2 Claims, 4 Drawing Sheets

SUBSTRATE TREATING SYSTEM

CROSS-REFERENCE TO RELATED APPLICATIONS

A claim for priority under 35 U.S.C. § 119 is made to Korean Patent Application No. 10-2016-0096810 filed Jul. 29, 2016, in the Korean Intellectual Property Office, the entire contents of which are hereby incorporated by reference.

BACKGROUND

Embodiments of the inventive concept described herein relate to a substrate treating system.

Contaminants such as particles, organic contaminants, and metallic contaminants on a surface of a substrate greatly influence the characteristics and yield rate of a device. Due to this, a cleaning process of removing various contaminants attached to a surface of a substrate or unnecessary films is very important, and a process of cleaning a substrate is performed before and after unit processes for manufacturing a semiconductor.

The cleaning methods used in the current semiconductor manufacturing process are largely classified into dry cleaning and wet cleaning, and the wet cleaning is classified into a bath type of removing contaminants through chemical solution by submerging a substrate in a chemical, and a single wafer type of removing contaminants by supplying a chemical onto a surface of a substrate while the substrate is rotated after being positioned on a spin chuck.

The single wafer type cleaning apparatus supplies a treatment liquid, deionized water, and a dry gas onto a substrate while the substrate is rotated at a high speed, and the treatment liquid, the deionized water, and the dry gas generate static electricity due to friction with the surface of the substrate.

In order to solve the charging of the static electricity and the unevenness of the electric field due to the static electricity, an ion generator is located in the interior of the process chamber in which various processes are performed. However, the conventional ion generator cannot actually efficiently remove static electricity of a substrate by removing static electricity or charged particles in a wide area in which processes are performed.

Further, in another method of removing static electricity, static electricity generated during a process and residing static electricity are removed by using an electrically conductive material in a substrate contact point. However, although much static electricity generated during a process is discharged to the outside through the electrically conductive material, static electricity is left without being further discharged once a specific amount of static electricity is discharged.

PRIOR TECHNICAL DOCUMENTS

Patent Documents

Korean Patent Application Publication No. 10-2012-0008854 (Feb. 1, 2012)

SUMMARY

Embodiments of the inventive concept provide a substrate treating apparatus that may remove static electricity of a substrate by stages.

Embodiments of the inventive concept also provide a substrate treating apparatus that may increase an effect of removing static electricity of a substrate.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating system including an index unit having a port, on which a container containing a substrate is positioned, and an index robot, a process executing unit having substrate treating apparatuses for treating the substrate and a main transferring robot for transferring the substrate, and a buffer unit disposed between the process executing unit and the index unit and in which the substrate transferred between the process executing unit and the index unit temporarily stays, wherein each of the index robot, the substrate treating apparatuses, the main transferring robot, and the buffer unit includes a conductive part contacting the substrate to remove static electricity of the substrate.

The conductive parts of the index robot, the substrate treating apparatuses, the main transferring robot, and the buffer unit may be formed of electrically conductive materials having different resistances.

The resistances of the conductive parts of the index robot, the substrate treating apparatuses, the main transferring robot, and the buffer unit may become lower such that static electricity removal capacities of the index robot, the substrate treating apparatuses, the main transferring robot, and the buffer unit sequentially increase.

Each of the substrate treating apparatuses may have a substrate support member in which the substrate is seated. The substrate support member may have a first conductive part contacting with the substrate, and the first conductive part is formed of an electrically conductive material having a resistance of $10^6 \Omega/sq$. The main transferring robot may have a first blade in which the substrate is seated, the first blade has a second conductive part contacting the substrate, and the second conductive part is formed of an electrically conductive material having a resistance of $10^5 \Omega/sq$. The buffer unit may have a slot in which the substrate is seated, the slot may have a third conductive part contacting the substrate, and the third conductive part may be formed of an electrically conductive material having a resistance of $10^4 \Omega/sq$. The index robot may have a second blade in which the substrate is seated, the second blade may have a fourth conductive part contacting the substrate, and the fourth conductive part may be formed of an electrically conductive material having a resistance of $10^3 \Omega/sq$.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
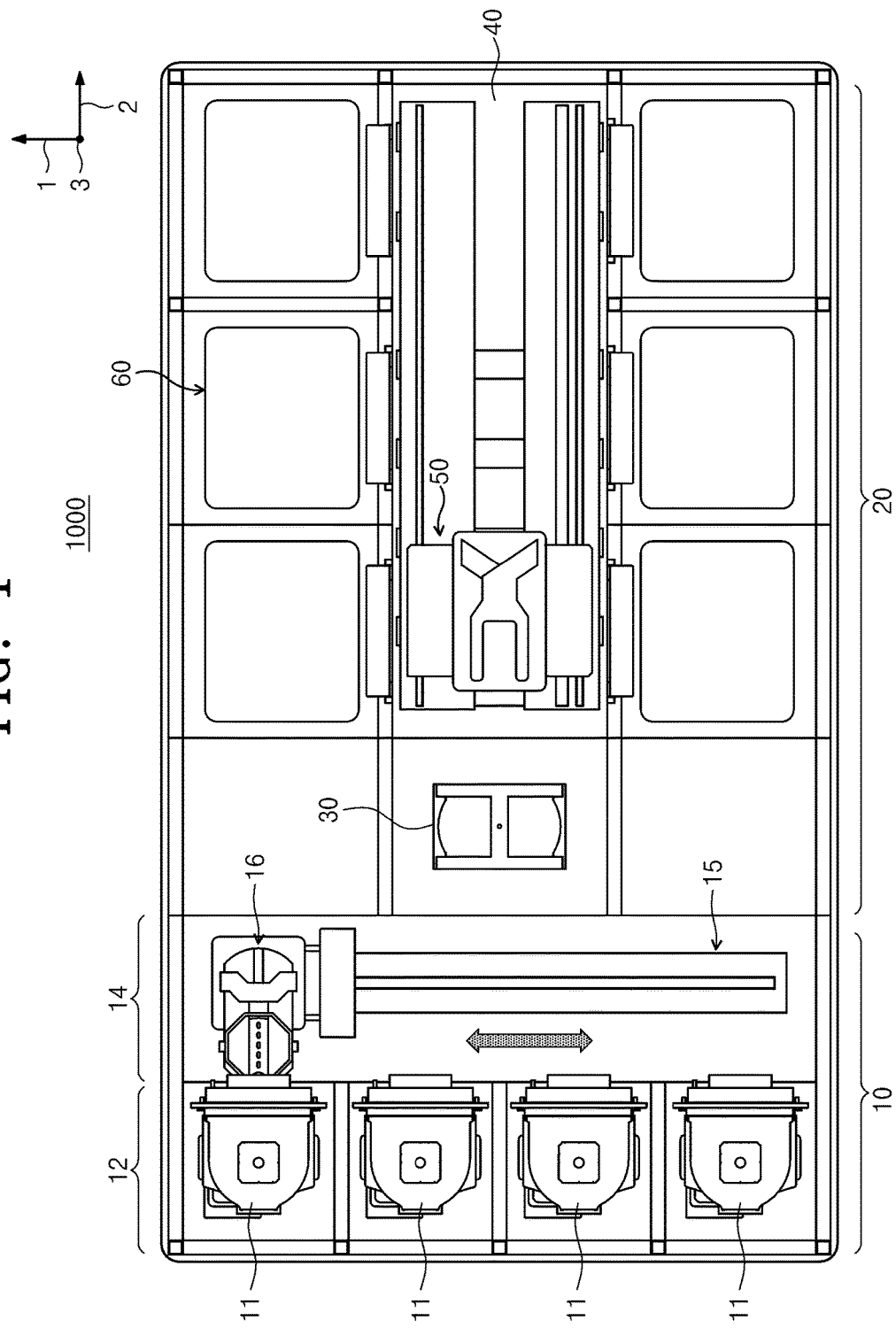
FIG. 1 is a plan view schematically illustrating a substrate treating system according to the present invention.

The present invention may be variously modified and may have various forms, and specific embodiments thereof will be illustrated in the drawings and described in detail. However, the present invention is not limited to specific disclosed forms, but it is understood that the scope of the present invention include all changes pertaining to the spirit and technical scope of the present invention, equivalents or replacements thereof. A detailed description of known technologies related to the present invention will be omitted to avoid making the technical essence of the present invention rather unclear.

The terminologies used herein are provided only to describe specific embodiments, and are not intended to limit the present invention. The terms of a singular form may include plural forms unless otherwise specified. The terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms such as first and second may be used to describe various elements, but the elements are not limited to the terms. The terms may be used only for the purpose of distinguishing one element from another element.

Hereinafter, embodiments of the present invention will be described with reference to the accompanying drawings, and in a description of the present invention, the same reference numerals are given to the same or corresponding elements regardless of the reference numerals and a repeated description thereof will be omitted.

FIG. 1 is a plan view schematically illustrating a substrate treating system according to the present invention.

Referring to FIG. 1, the substrate treating system 1000 according to the present invention may include an index unit 10 and a process executing unit 20. The index unit 10 and the process executing unit 20 are disposed in a row. Hereinafter, a direction in which the index unit 10 and the process executing unit 20 are disposed will be referred to as a first direction 1, a direction that is perpendicular to the first direction 1 when viewed from the top will be referred to as a second direction 2, and a direction that is normal to a plane containing the first direction 1 and the second direction 2 will be referred to as a third direction 3.

The index unit 10 is disposed in front of the substrate treating system 1000 in the first direction 1. The index unit 10 includes a plurality of load ports 12 and a transferring frame 14.

A carrier 11, in which a substrate W is received, is seated on the load port 12. A plurality of load ports 12 are provided, and are arranged along the second direction 2 in a row. However, the number of the load ports 12 may increase or decrease according to the process efficiency of the substrate treating system 1000 or a footprint condition. A front opening unified pod (FOUP) may be used as the carrier 11. The carrier 11 has a plurality of slots for receiving the substrates while the substrates are disposed in parallel to the ground surface.

The transferring frame 14 is disposed adjacent to the load ports 12 in the first direction. The transferring frame 14 is disposed between the load ports 12 and a buffer unit 30 of the process executing unit 20. The transferring frame 14 includes an index rail 15 and an index robot 16. The index robot 16 is seated on the index rail 15. The index robot 16 transfers the substrate W between the buffer unit 30 and the carrier 11. The index robot 16 linearly moves in the second direction 2 along the index rail 15, or rotates about the third direction 3.

The process executing unit 20 is disposed adjacent to the index unit 10 behind the substrate treating system 1000 along the first direction 1. The process executing unit 20 includes a buffer unit 30, a movement path 40, a main transferring robot 50, and a substrate treating apparatus 60.

The buffer unit 30 is disposed in front of the process executing unit 20 along the first direction 1. The buffer unit 30 is a place where the substrate W stands by after being temporarily received, before the substrate W is fed between the substrate treating apparatus 60 and the carrier 11. Slots (see FIG. 4) in which the substrates W are positioned are provided in the buffer unit 30, and a plurality of slots are provided to be spaced apart from each other along the third direction 3.

The movement path 40 is disposed to correspond to the buffer unit 30. A lengthwise direction of the movement path 40 is parallel to the first direction. The movement path 40 provides a passage through which the main transferring robot 50 moves. The substrate treating apparatuses 60 are disposed on opposite sides of the movement passage 40 along the first direction 1 to face each other. The main transferring robot 50 moves through the movement passage 40 along the first direction 1, and a movement rail along which the main transferring robot 50 may elevate to the upper and lower sides of the substrate treating apparatus 60 and to the upper and lower sides of the buffer unit 30 is installed.

The main transferring robot 50 is installed in the movement passage 40, and transfers the substrate W between the substrate treating apparatuses 60 and the buffer unit 30 or between the substrate treating apparatuses 60. The main transferring robot 50 linearly moved in the second direction 2 along the movement passage 40 or rotates about the third direction 3.

A plurality of substrate treating apparatuses 60 are provided, and are disposed on opposite sides of the movement passage 40 along the second direction 2. Some of the substrate treating apparatuses 60 are disposed along the lengthwise direction of the movement passage 40. Furthermore, some of the substrate treating apparatuses 60 are disposed to be stacked on each other. That is, the substrate treating apparatuses 60 having an array of A by B may be arranged on one side of the movement passage 40. Here, A is the number of the substrate treating apparatuses 60 provided in a row along the first direction 1, and B is the number of the substrate treating apparatuses 60 provided in a row along the second direction 2. When four or six substrate treating apparatuses 60 are provided on one side of the movement passage 40, the substrate treating apparatuses 60 may be disposed in an array of 2 by 2 or 3 by 2. The number of the substrate treating apparatuses 60 may increase or decrease. Unlike this, the substrate treating apparatuses 60 may be provided only on one side of the movement passage 40. Further, unlike this, the substrate treating apparatuses 60 may be provided on one side or opposite sides of the movement passage 40 in a single layer.

The substrate treating apparatuses 60 may perform a cleaning process on the substrate W. The substrate treating apparatus 60 may have different structures according to the types of the cleaning processes. Alternatively, the substrate treating apparatuses 60 may have the same structure. Selectively, the substrate treating apparatuses 60 are classified into a plurality of groups such that the structures of the substrate treating apparatuses 60 pertaining to the same group are the same and the structures of the substrate treating apparatuses 60 pertaining to different groups are different. For example, when the substrate treating apparatuses 60 are classified into two groups, the substrate treating apparatuses 60 pertaining to the first group may be provided on one side of the movement passage 40 and the substrate treating apparatuses 60 pertaining to the second group may be provided on an opposite side of the movement passage 40. Selectively, the substrate treating apparatuses 60 pertaining to the first group and the substrate treating apparatuses 60 pertaining to the second group may be provided on the lower and upper sides, respectively, on opposite sides of the movement passage 40. The first group of substrate treating apparatuses 60 and the second group of substrate treating apparatuses 60 may be classified according to the kinds of the used chemicals or the types of cleaning methods. Unlike this, the first group of substrate treating apparatuses 60 and the second group of substrate treating apparatuses 60 may sequentially perform processes on one substrate W.

Figure 2:
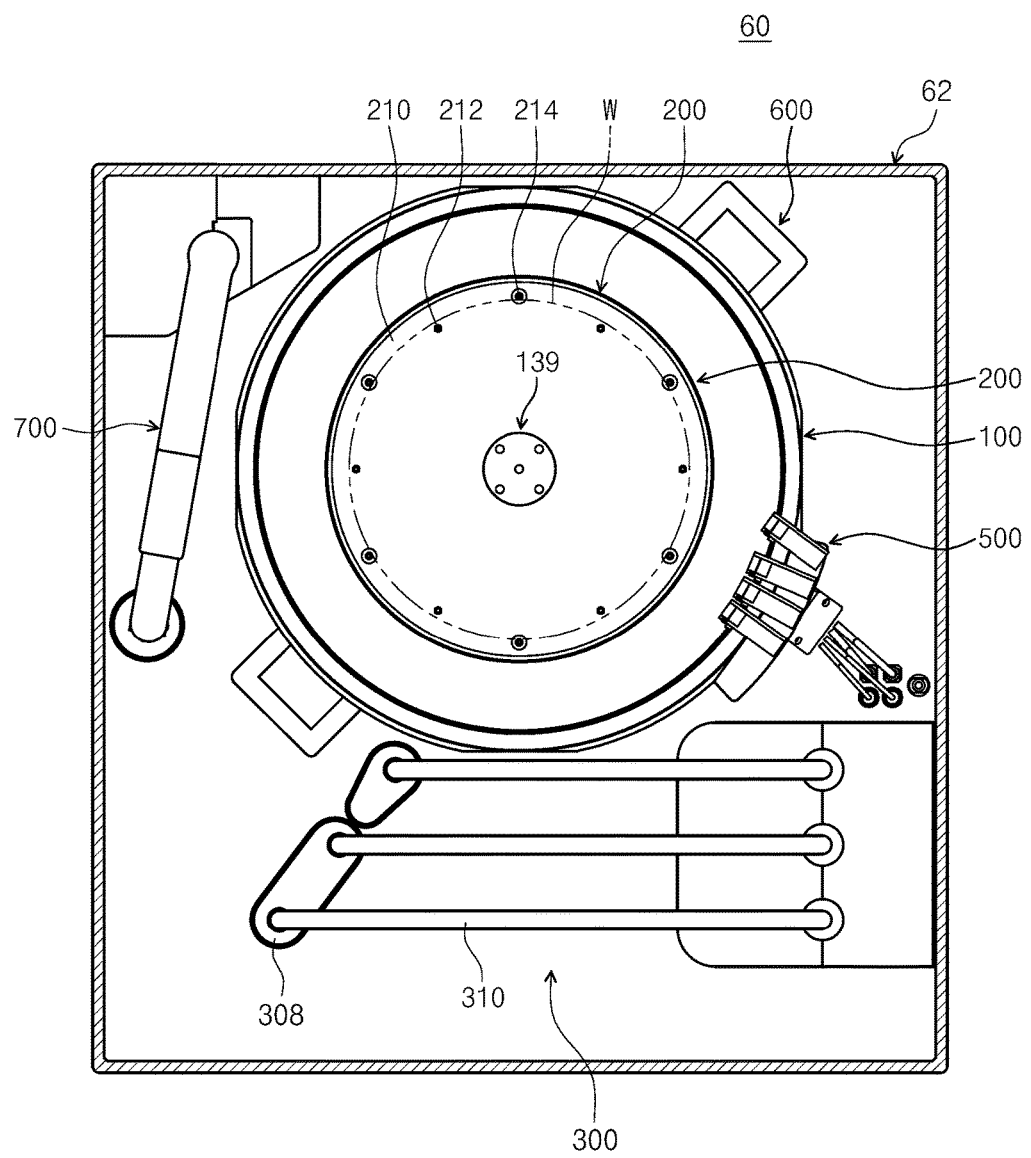
FIG. 2 is a plan view illustrating a configuration of a single wafer type substrate treating apparatus according to the present invention.
Figure 3:
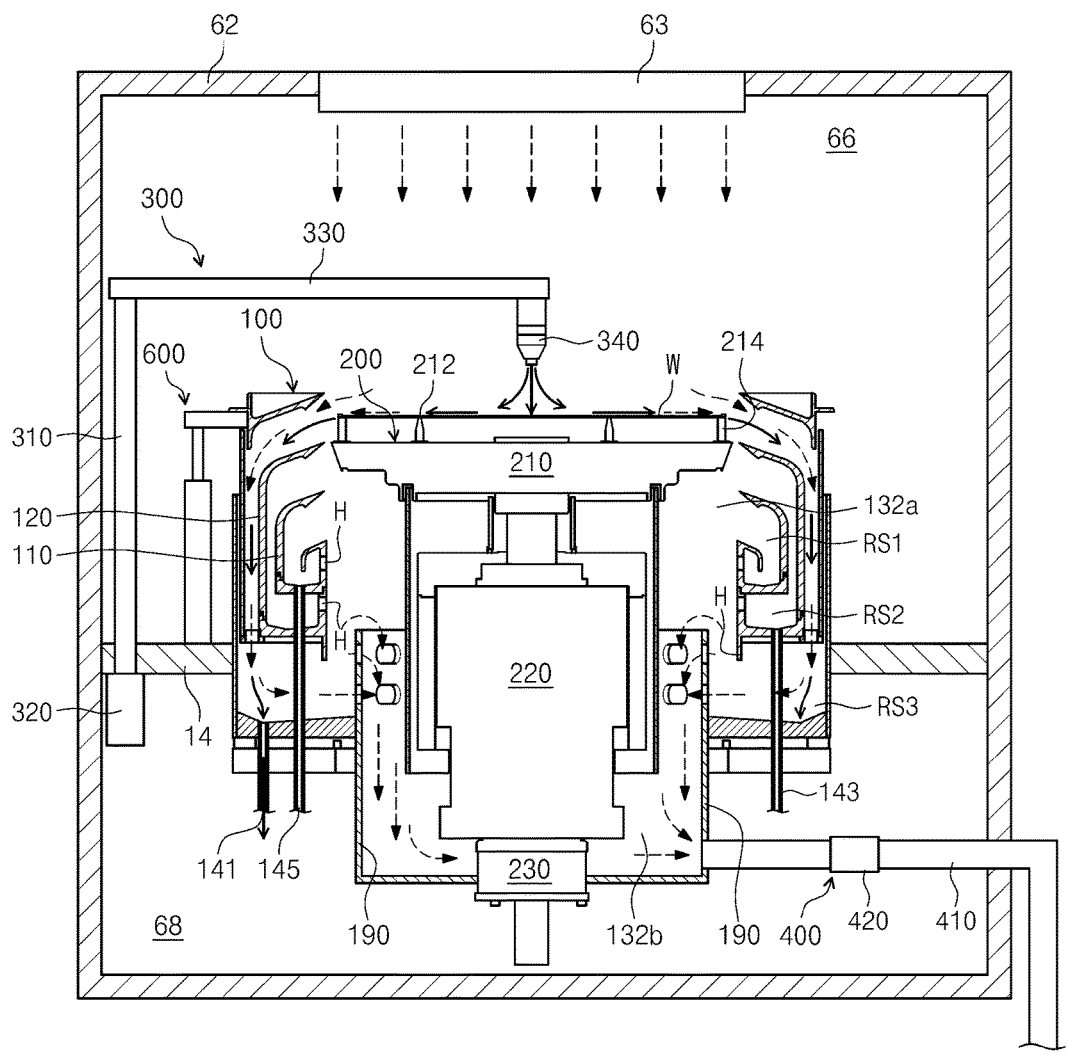
FIG. 3 is a side view illustrating a configuration of the substrate treating apparatus of FIG. 2.

FIG. 2 is a plan view illustrating a configuration of a single wafer type substrate treating apparatus according to the present invention. FIG. 3 is a sectional view illustrating a treatment container and a substrate support member in the substrate treating apparatus of FIG. 2.

Although it has been described in the embodiment that a substrate treated by the single wafer type substrate treating apparatus 1 is a semiconductor substrate as an example, the present invention is not limited thereto but may be applied to various kinds of substrates such as a liquid crystal display device or a glass substrate.

Referring to FIGS. 2 and 3, the substrate treating apparatus 60 according to the present invention is an apparatus for removing foreign substances and a film residing on a surface of a substrate by using various treatment fluids, and includes a chamber 62, a treatment container 100, a substrate support member 200, first swing nozzle units 300, a fixed nozzle 500, a second swing nozzle unit 700, and an exhaustion member 400.

The chamber 62 provides a closed interior space, and a fan filter unit 63 is installed at an upper portion of the chamber 62. The fan filter unit 63 generates vertical currents in the interior of the chamber 62.

The fan filter unit 63 is a module in which a filter and an air supply fan is integrated into one unit, and is an apparatus for filtering clean air and supplying the filtered air into the chamber. The clean air passes through the fan filter unit 63 and is supplied into the interior of the chamber 62 to form vertical currents. The vertical currents of the air provides uniform currents on the substrate, and the contaminants (fumes) generated in a process of treating a surface of the substrate by the treatment fluid are discharged together with the air to the exhaustion member 400 through suction ducts of the treatment container 100 to be removed so that high cleanness is maintained in the interior of the treatment container.

The chamber 62 is divided into a process area 66 and a maintenance area 68 by a horizontal partition 64. Although only some of them are illustrated in the drawings, the maintenance area 68 is a space in which in addition to discharge lines 141, 143, and 145 connected to the treatment container 100 and the sub-exhaust line 410, a driver of the elevation unit, a driver 300b of the first swing nozzle unit 300, and a supply line are located, and it is preferable that the maintenance area 68 be isolated from the process area in which the substrate is treated.

The treatment container 100 has an open-topped cylindrical shape, and provides a process space for treating the substrate W. The opened upper surface of the treatment container 100 is provided as a carrying-in/out passage of the substrate W. The substrate support member 200 is located inside the treatment container 100. During the process, the substrate support member 200 supports the substrate W and rotates the substrate W.

Referring to FIG. 3, the treatment container 100 provides an upper space 132a in which the spin head 210 is located, and a lower space 132b distinguished from the upper space 132a by the spin head 210 and in which the exhaust duct 190 is connected to a lower end thereof such that exhaustion may be compulsorily made. First, second, and third annular suction ducts 110, 120, and 130 for introducing and suctioning the treatment fluid spattering on the rotating substrate, gases, and fumes are disposed in multiple stages are disposed in the upper space 132a of the treatment container 100. Each of the first, second, and third annular suction ducts 110, 120, and 130 has an exhaust hole H communicating with one common annular space (corresponding to a lower space of the container). An exhaust duct 190 connected to the exhaustion member 400 is provided in the lower space 132b.

In detail, each of the first to third suction ducts 110, 120, and 130 includes a bottom surface having an annular ring shape, and a side wall extending from the bottom surface and having a cylindrical shape. The second suction duct 120 surrounds the first suction duct 110, and is spaced apart from the first suction duct 110. The third suction duct 130 surrounds the second suction duct 120, and is spaced apart from the second suction duct 120.

The first to third suction ducts 110, 120, and 130 provide first to third recovery spaces RS1, RS2, and RS3 into which the treatment fluid spattering from the substrate W and the gases containing fumes are introduced. The first recovery space RS1 is defined by the first suction duct 110, the second recovery space RS2 is defined by a space between the first suction duct 110 and the second suction duct 120, and the third recovery space RS3 is defined by a space between the second suction duct 120 and the third suction duct 130.

The centers of the upper surfaces of the first to third suction ducts 110, 120, and 130 are opened, and have an inclined surface a distance from the bottom surface of which gradually increases as it goes from the side wall towards the opening. Accordingly, the treatment fluid spattering from the substrate W flows into the recovery spaces RS1, RS2, and RS3 along the upper surfaces of the first to third suction ducts 110, 120, and 130.

The first treatment liquid introduced into the first recovery space RS1 is discharged to the outside through the first recovery line 145. The second treatment liquid introduced into the second recovery space RS2 is discharged to the outside through the second recovery line 143. The third treatment liquid introduced into the third recovery space RS3 is discharged to the outside through the third recovery line 141.

Meanwhile, the treatment container 100 is coupled to the elevation unit 600 that changes a vertical location of the treatment container 100. The elevation unit 600 linearly moves the container 100 upwards and downwards. When the container 100 is moved upwards and downwards, a relative height of the container 100 to the spin head 210 is changed. The treatment container 100 is lowered such that, when the substrate W is loaded on the spin head 210 or is unloaded from the spin head 210, the spin head 210 protrudes to the upper side of the treatment container 100.

When the process is performed, the height of the container 100 is adjusted such that the treatment liquid is introduced into the suction ducts 110, 120, and 130 according to the kind of the treatment liquid supplied to the substrate W. Accordingly, a relative vertical location between the treatment container 100 and the substrate W is changed. Accordingly, the treatment container 100 may make the kinds of the treatment liquids and the contaminated gases recovered for the recovery spaces RS1, RS2, and RS3 different.

In the embodiment, the substrate treating apparatus 60 vertically moves the treatment container 100 to change a relative vertical location between the treatment container 100 and the substrate support member 200. However, the substrate treating apparatus 60 may vertically move the substrate support member 200 to change a relative vertical location between the treatment container 100 and the substrate support member 200.

The substrate support member 200 is installed inside the treatment container 100. The substrate support member 200 may support the substrate W during the process, and may be rotated by the driver 240, which will be described below, during the process. The substrate support member 200 has a spin head 210 having a circular upper surface, and support pins 212 supporting the substrate W and chucking pins 214 may be provided on an upper surface of the spin head 210. The support pins 212 are disposed in a specific array at a periphery of the upper surface of the spin head 210 to be spaced apart from each other, and protrude upwards from the spin head 210. The support pins 212 support the lower surface of the substrate W such that the substrate W is supported while being spaced upwards apart from the spin head 210. The chucking pins 214 are disposed on the outside of the support pins 212, and protrude upwards. The chucking pins 214 arrange the substrate W such that the substrate W supported by a plurality of support pins 212 may be positioned at a proper location on the spin head 210. During the process, the chucking pins 214 contact a side of the substrate W to prevent the substrate W from deviating from the proper location.

The support shaft 220 supporting the spin head 210 is connected to a lower side of the spin head 210, and the support shaft 220 is rotated by the driver 240 connected to a lower end thereof. The driver 240 may be a motor or the like. As the support shaft 220 is rotated, the spin head 210 and the substrate W are rotated.

The exhaustion member 400 provides an exhaust pressure (suction pressure) to the first to third suction ducts 110, 120, and 130 during the process. The exhaustion member 400 includes a sub-exhaust line 410 connected to the exhaust duct 190, and a damper 420. The sub-exhaust line 410 receives an exhaust pressure from an exhaust pump (not illustrated), and is connected to a main exhaust line buried in the bottom space of a semiconductor production line (fabrication facility).

The fixed nozzle units 500 are fixedly installed at an upper end of the treatment container 100, and supply super-pure water, ozone water, and nitrogen gases to the center of the substrate.

In the embodiment, the first swing nozzle unit and the second swing nozzle unit may be treatment liquid ejection units.

The second swing nozzle unit 700 is swung to the upper side of the center of the substrate to supply a fluid for drying the substrate onto the substrate. The fluid for drying may include isopropyl alcohol and nitrogen gases of high temperature.

The first swing nozzle units 300 are located outside the treatment container 100. The first swing nozzle units 300 are rotated through boom swinging, and supply a treatment fluid (an acid liquid, an alkali liquid, a neutral liquid, and a drying gas) for cleaning or etching the substrate to the substrate W positioned on the spin head 210. As illustrated in FIG. 2, it can be seen that because the first swing nozzle units 300 are disposed in parallel and the distances of the first swing nozzle units 300 from the treatment container 100 are different, the lengths of the first swing nozzle units 300 are different according to the radius of rotation thereof.

Each of the first swing nozzle units 300 may include a support shaft 310, a driver 320, a nozzle support 330, and a nozzle 340. A lengthwise direction of the support shaft 310 is the third direction, and a lower end of the support shaft 310 is coupled to the driver 320. The driver 320 rotates and elevates the support shaft 310. The nozzle support 330 is vertically coupled to an end opposite to an end of the support shaft 320 coupled to the driver 320. The nozzle 340 is installed on the bottom surface of an end of the nozzle support 330. The nozzle 340 is moved to a process location and a standby location by the driver 320. The process location is a location at which the nozzle 340 is disposed on the vertically upper side of the center of the substrate, and is a location at which the nozzle 340 deviates from the upper side of the substrate.

Meanwhile, in the substrate treating system 1000, the substrate W contacts the index robot 16, the buffer unit 30, the main transferring robot 50, and the spin head 210 of the substrate treating apparatus, and each of the units (the index robot, the substrate treating apparatus, the main transferring robot, and the buffer unit) in contact with the substrate includes a conductive part for removing static electricity of the substrate.

Figure 4:
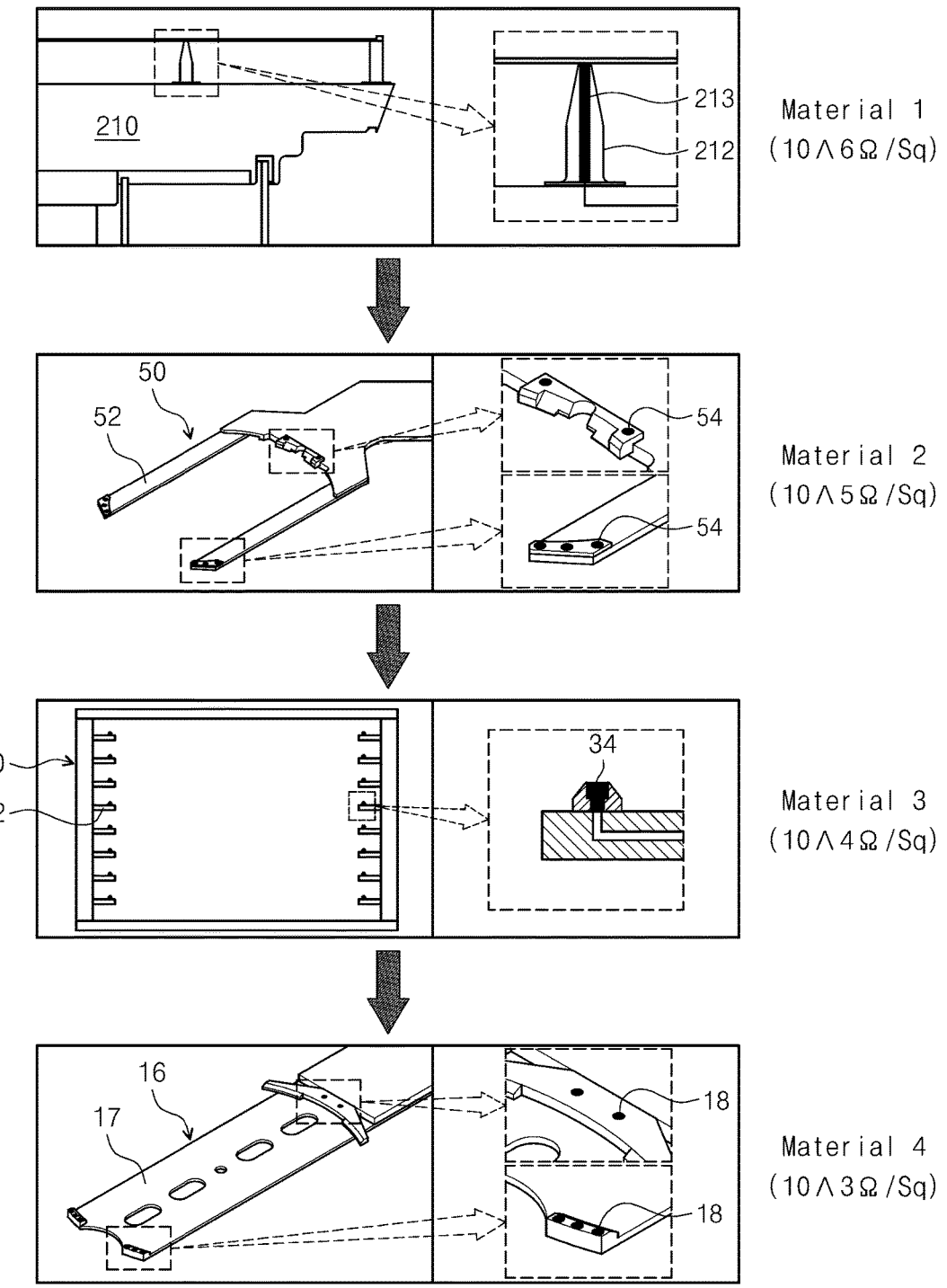
FIG. 4 illustrates views of conductive parts of units contacting a substrate.

Referring to FIG. 4, the spin head 210 may include a first conductive part 213. The first conductive part 213 may be provided in the support pin 212 in contact with the substrate or the whole support pin 212 may be formed of a conductive material.

The main transferring robot 50 may have a first blade 52 on which the substrate is seated, and the first blade 52 may include a second conductive part 54 in contact with the substrate.

The buffer unit 30 may have a slot 32 in which the substrate is seated, and the slot may include a third conductive part 34 in contact with the bottom surface of the substrate.

The index robot 16 may have a second blade 17 on which the substrate is seated, and the second blade 17 may include a fourth conductive part 54 in contact with the substrate.

The first conductive part 213, the second conductive part 54, the third conductive part 34, and the fourth conductive part 18 may be formed of conductive material having different resistances. That is, the first conductive part 213, the second conductive part 54, the third conductive part 34, and the fourth conductive part 18 may have resistances such that static electricity removal capacities may sequentially increase in the sequence of the substrate treating apparatus 60, the main transferring robot 50, the buffer unit 30, and the index robot 16. Meanwhile, the conductive parts are connected to a ground line to discharge the static electricity of the substrate to the outside.

As an example, the first conductive part 213 may include a conductive material (carbon (30%) Peek) having a resistance of $10^6 \Omega/sq$, the second conductive part 54 may include a conductive material (carbon (50%) Peek) having a resistance of $10^5 \Omega/sq$, the third conductive part 34 may include a conductive material (nano carbon Peek) having a resistance of $10^4 \Omega/sq$, and the fourth conductive part 18 may include a conductive material (aluminum) having a resistance of $10^3 \Omega/sq$.

Meanwhile, each of the conductive parts 213, 54, 34, and 18 may include a heat radiating plate structure to increase static electricity removal capacity, and the number of the contact points may increase from four to six.

In this way, pattern damage by an instantaneous charge difference may be reduced when the residual static electricity of the substrate is reduced to 15 V/cm in the case of 14 μm by 100 V/cm or more (90 μm), by removing the static electricity by stages by sequentially increasing the conductivities from the spin head 210.

According to an embodiment of the present invention, pattern damage by an instantaneous charge difference may be prevented by removing static electricity of a substrate by stages.

According to an embodiment of the present invention, an effect of removing static electricity of a substrate may be increased.

The effects of the present invention are not limited to the above-mentioned effects, and the unmentioned effects can be clearly understood by those skilled in the art to which the present invention pertains from the specification and the accompanying drawings.

The above description is a simple exemplification of the technical spirit of the present invention, and the present invention may be variously corrected and modified by those skilled in the art to which the present invention pertains without departing from the essential features of the present invention. Therefore, the disclosed embodiments of the present invention do not limit the technical spirit of the present invention but are illustrative, and the scope of the technical spirit of the present invention is not limited by the embodiments of the present invention. The scope of the present invention should be construed by the claims, and it will be understood that all the technical spirits within the equivalent range fall within the scope of the present invention.

What is claimed is:

1. A substrate treating system comprising:
   an index unit having a port, on which a container containing a substrate is positioned, and an index robot;
   a process executing unit having substrate treating apparatuses for treating the substrate and a main transferring robot for transferring the substrate; and
   a buffer unit disposed between the process executing unit and the index unit and in which the substrate transferred between the process executing unit and the index unit temporarily stays,
   wherein each of the index robot, the substrate treating apparatuses, the main transferring robot, and the buffer unit includes a conductive part contacting the substrate to remove static electricity of the substrate;
   wherein the conductive parts of the index robot, the substrate treating apparatuses, the main transferring robot, and the buffer unit are formed of electrically conductive materials having different resistances, and
   wherein the resistances of the conductive parts of the index robot, the substrate treating apparatuses, the main transferring robot, and the buffer unit become lower such that static electricity removal capacities of the index robot, the substrate treating apparatuses, the main transferring robot, and the buffer unit sequentially increase.

2. The substrate treating system of claim 1, wherein each of the substrate treating apparatuses has a substrate support member in which the substrate is seated,
   wherein the substrate support member has a first conductive part contacting with the substrate, and the first conductive part is formed of an electrically conductive material having a resistance of $10^6 \Omega/sq$,
   wherein the main transferring robot has a first blade in which the substrate is seated, the first blade has a second conductive part contacting the substrate, and the second conductive part is formed of an electrically conductive material having a resistance of $10^5 \Omega/sq$,
   wherein the buffer unit has a slot in which the substrate is seated, the slot has a third conductive part contacting the substrate, and the third conductive part is formed of an electrically conductive material having a resistance of $10^4 \Omega/sq$, and
   wherein the index robot has a second blade in which the substrate is seated, the second blade has a fourth conductive part contacting the substrate, and the fourth conductive part is formed of an electrically conductive material having a resistance of $10^3 \Omega/sq$.

* * * * *